United States Patent
Ao et al.

(10) Patent No.: US 8,302,291 B2
(45) Date of Patent: Nov. 6, 2012

(54) COMPONENT MOUNTING SYSTEM

(75) Inventors: Hiroyuki Ao, Okazaki (JP); Tomohiko Hattori, Kariya (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 0 days.

(21) Appl. No.: 13/101,596

(22) Filed: May 5, 2011

(65) Prior Publication Data

US 2011/0283530 A1 Nov. 24, 2011

(30) Foreign Application Priority Data

May 20, 2010 (JP) ................................. 2010-116793

(51) Int. Cl.
*B23P 19/00* (2006.01)

(52) U.S. Cl. ................ 29/740; 29/739; 29/741; 29/742; 29/719; 29/832; 414/752.1

(58) Field of Classification Search ............ 29/740–743, 29/833–834; 414/752.1, 737; 198/468.4
See application file for complete search history.

(56) References Cited

U.S. PATENT DOCUMENTS

| 5,894,657 | A  | * | 4/1999  | Kanayama et al. | 29/740 |
| 7,036,215 | B2 | * | 5/2006  | Kodama | 29/832 |
| 7,841,073 | B2 | * | 11/2010 | Mitsumochi et al. | 29/743 |
| 7,930,821 | B2 | * | 4/2011  | Nies | 29/832 |
| 8,020,285 | B2 | * | 9/2011  | Nies et al. | 29/832 |

FOREIGN PATENT DOCUMENTS

| JP | 2004-104075 A | 4/2004 |
| JP | 2007-318000 A | 12/2007 |

* cited by examiner

*Primary Examiner* — Minh Trinh

(74) *Attorney, Agent, or Firm* — Foley & Lardner LLP

(57) ABSTRACT

A component mounting system including mounting machines along a direction of conveying a circuit board; a feeder mount base in each of the mounting machines; a feeder removably mounted on the feeder mount base of each of the mounting machines; a mounting head in each of the mounting machines, the mounting head sucking a component supplied from the feeder for mounting on the circuit board; a moving mechanism in each of the mounting machines, the moving mechanism configured to removably mount and move the mounting head; an inspection camera unit configured to image an inspection target part of the circuit board; and an inspection image processing unit mounted, replaceably with the feeder, on the feeder mount base where the inspection camera unit is mounted, the inspection image processing unit processing an image signal output from the inspection camera unit to inspect the inspection target part.

8 Claims, 5 Drawing Sheets

COMPONENT MOUNTING SYSTEM

BACKGROUND OF THE INVENTION

1. Field of the Invention

The present invention relates to a component mounting system in which an arbitrary mounting machine among a plurality of mounting machines arranged in alignment along a direction of conveying the circuit board can be equipped with a function of imaging, with a camera, an inspection target part of a circuit board and inspecting the inspection target part.

2. Description of the Related Art

In recent years, in order to easily support various forms of production of electronic component mounted board, as described in Japanese Unexamined Patent Application Publication No. 2004-104075, a module-type component mounting system has been developed in which a plurality of mounting machine modules arranged on a base in alignment along a direction of conveying the circuit board and the circuit board is conveyed to each mounting machine module in sequence for mounting a component on the circuit board. The patent gazette mentioned above describes that an inspection machine that inspects an inspection target part of a circuit board may be included in the module-type component mounting system.

However, a general-purpose inspection machine cannot be mounted on the base of the module-type component mounting system. Therefore, to mount an inspection machine on the base of the module-type component mounting system, a dedicated inspection machine module has to be newly manufactured with the size or installation structure of the inspection machine being changed according to the size or installation structure of the mounting machine module, thereby increasing a load in cost.

Moreover, depending on the type of a component to be mounted on the circuit board, the position of the inspection machine module may be required to be changed by exchanging the positions of the mounting machine module and the inspection machine module. For example, when a production job is such that a mounting machine module on an upstream side mounts an electronic component required to be shielded on a circuit board and a mounting machine module on a downstream side mounts a shielding case so as to cover the electronic component, the mounting state of the electronic component is preferably inspected before the shielding case is mounted. When a production job is such that any one of the mounting machine modules mounts a BGA-type component, the state of a mounting surface of the circuit board (for example, the presence or absence of a foreign substance) may preferably be inspected before the BGA-type component is mounted, in some cases.

However, in the structure described above, to change the position of the inspection machine module according to a change of the production job, an operation of changing the positions of the mounting machine module and the inspection machine module has to be performed, thereby disadvantageously causing the trouble of handling this operation to possibly decrease the operation rate of the component mounting system.

On the other hand, a mounting machine described in Japanese Unexamined Patent Application Publication No. 2007-318000 has a plurality of mounting heads removably mounted thereon. Any one of the mounting heads is replaced with a camera-equipped inspection head, and the component mounting state in the circuit board and others can be imaged by the camera in the mounting machine for inspection. In this mounting machine, an image signal output from the inspection head is processed by a control computer of the mounting machine. However, since image processing for inspection has a large load of arithmetic operation, difficult for a control computer of the mounting machine to concurrently perform a process of controlling the mounting operation and the image processing for inspection at high speed. For this reason, disadvantageously, the control computer of the mounting machine has to be replaced with a computer having a higher arithmetic processing performance, or the resolution (resolving power) of image processing for inspection is restricted to a low resolution with a small load of arithmetic operation to decrease inspection accuracy.

SUMMARY OF THE INVENTION

In a component mounting system, a plurality of mounting machines are arranged in alignment along a direction of conveying a circuit board, and each of the mounting machines is provided with a feeder mount base having a feeder removably mounted thereon and a moving mechanism having a mounting head removably mounted thereon, the mounting head sucking a component supplied from the feeder for mounting on the circuit board. In the component mounting system, an inspection camera unit that images an inspection target part of the circuit board is mounted, replaceably with the mounting head, on a moving mechanism of any one of the plurality of mounting machines and, on a feeder mount base of that mounting machine, an inspection image processing unit that processes an image signal output from the inspection camera unit to inspect the inspection target part of the circuit board is mounted replaceably with the feeder.

In this structure, the inspection camera unit is removably mounted, in place of a mounting head, on the moving mechanism of any one of the mounting machines, and the inspection image processing unit is removably mounted, in place of a feeder, on the feeder mount base of that mounting machine. Therefore, a dedicated inspection machine module is not required to be newly manufactured, thereby reducing a burden of cost. Also, since all what is required is to have the inspection camera unit and the inspection image processing unit mounted on any of the mounting machines, an operation of changing the position of an inspection device at the time of changing a production job can be simplified, its operation time can be shortened, and the operation rate of the component mounting system can be improved. Furthermore, an image signal is processed at the inspection image processing unit mounted on the feeder mount base of the mounting machine for inspecting the inspection target part of the circuit board. Therefore, the load of arithmetic operation of a control computer in the component mounting system can be prevented from being increased due image processing for inspection, and high-resolution image processing can be performed at the inspection image processing unit to improve inspection accuracy.

For example, when a production job is such that a mounting machine on an upstream side mounts an electronic component required to be shielded on a circuit board and a mounting machine on a downstream side mounts a shielding case on the circuit board so as to cover the electronic component, the mounting machine having the inspection camera unit and the inspection image processing unit mounted thereon can be selected from among mounting machines positioned between the mounting machine that mounts the electronic component required to be shielded and a mounting machine that mounts the shielding case. With this, a mounting state of the shielding target component can be inspected before mounting of the shielding case.

Also, when a production job is such that any one of the plurality of mounting machines mounts a BGA-type component, the mounting machine having the inspection camera unit and the inspection image processing unit mounted thereon is selected from among mounting machines positioned on a side upstream from the mounting machine that mounts the BGA-type component. With this, the state of a mounting surface of the circuit board (such as the presence or absence of a foreign substance) can be inspected before the BGA-type component is mounted.

Furthermore, the inspection image processing unit is preferably configured to include a display unit that displays inspection information and an inspection setting function of setting an inspection method by an operator. With this, the operator can easily check the inspection information and set an inspecting method. Note that a function of displaying the inspection information and a function of setting an inspecting method may be provided to a control device of the component mounting system and, as a matter of course, both of these functions may be provided to both of the inspection image processing unit and the control device of the component mounting system.

Still further, the inspection camera unit is preferably configured to include an illumination device that illuminates the inspection target part of the circuit board. With this, accuracy of image processing can be improved.

In this case, preferably, the illumination device includes illumination light sources of a plurality of types, and is configured to allow an illumination pattern to be selected from among a plurality of illumination patterns obtained by combining the illumination light sources of the plurality of types. With this, an appropriate illumination pattern can be selected from among the plurality of illumination patterns according to the shape (for example, a flat surface, a three-dimensional shape, projections and depression, and others), material, and others of the inspection target part of the circuit board, thereby further improving inspection accuracy by image processing.

Still further, the inspection image processing unit may be configured to include learning means that learns conforming-item data obtained through an inspection and inspecting means that inspects the inspection target part by comparing a result of image processing of the inspection target part of the circuit board with the conforming-item data learned by the learning means. When the result of image processing of the inspection target part is different from the learning result of the conforming-item data, that means the presence of some abnormality in the inspection target part, and therefore the circuit board can be determined as defective.

Still further, a conveyor that discharges a circuit board determined by the inspection image processing unit as defective may be removably mounted on a feeder mount base of the mounting machine having the inspection camera unit and the inspection image processing unit mounted thereon or a mounting machine that comes immediately thereafter. With this, the circuit board determined as defective through an inspection can be discharged by a conveyer without being passed to a mounting machine on a downstream side. Therefore, when the defective part of the circuit board is repairable, the remaining components can be mounted with the defective part repaired, thereby improving yields.

DETAILED DESCRIPTION OF THE PREFERRED EMBODIMENT

An embodiment obtained by applying a mode for carrying out the present invention to a module-type component mounting system is described below.

Figure 1:
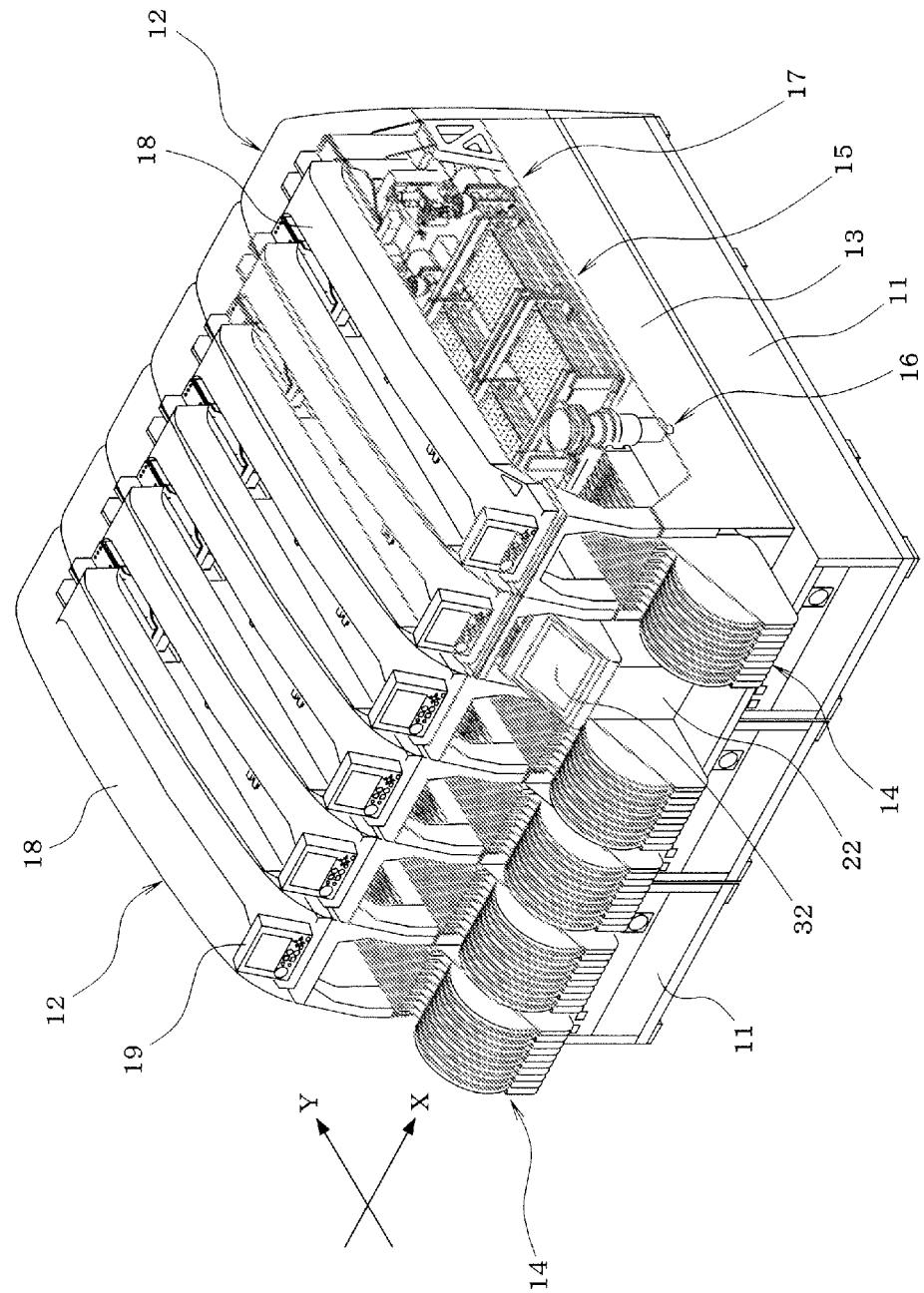
FIG. 1 is a perspective view schematically depicting an example of structure when an inspection image processing unit and others are mounted on a component mounting system according to an embodiment of the present invention.
Figure 2:
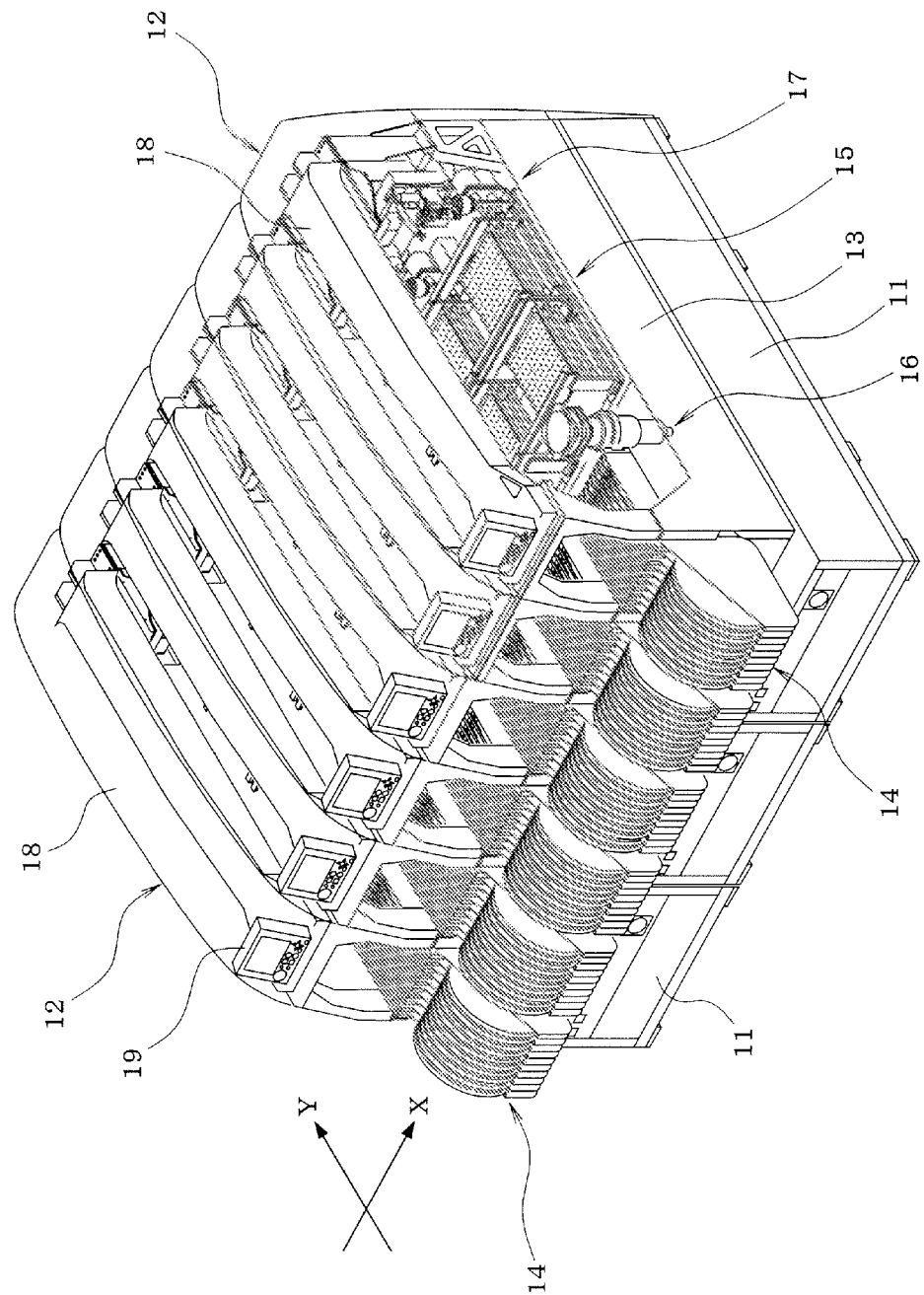
FIG. 2 is a perspective view schematically depicting an example of structure when an inspection image processing unit and others are not mounted on the component mounting system.

The structure of a module-type component mounting system is described based on FIG. 1 and FIG. 2.

On a base 11 of the module-type component mounting system, a plurality of mounting machine modules 12 are replaceably arranged in alignment adjacently in a direction of conveying a circuit board. Each of the mounting machine modules 12 is configured with a feeder 14, such as a tape feeder, a circuit board conveying device 15, a component imaging device 16, a mounting head 17, and others mounted on a body bed 13, and an operation panel part 19 is provided on a front surface of an upper frame 18.

By the circuit board conveying device 15 of each of the mounting machine modules 12, a circuit board is conveyed in sequence, and a component is mounted on the circuit board by the mounting head 17 of each of the mounting machine modules 12. Each of the mounting machine modules 12 is provided with a feeder mount base (not shown) and a moving mechanism 20 (refer to FIG. 5) moving in X, Y, and Z directions. The feeder 14 is removably mounted on a feeder mount base, and the mounting head 17 is removably mounted on the moving mechanism 20.

Figure 3:
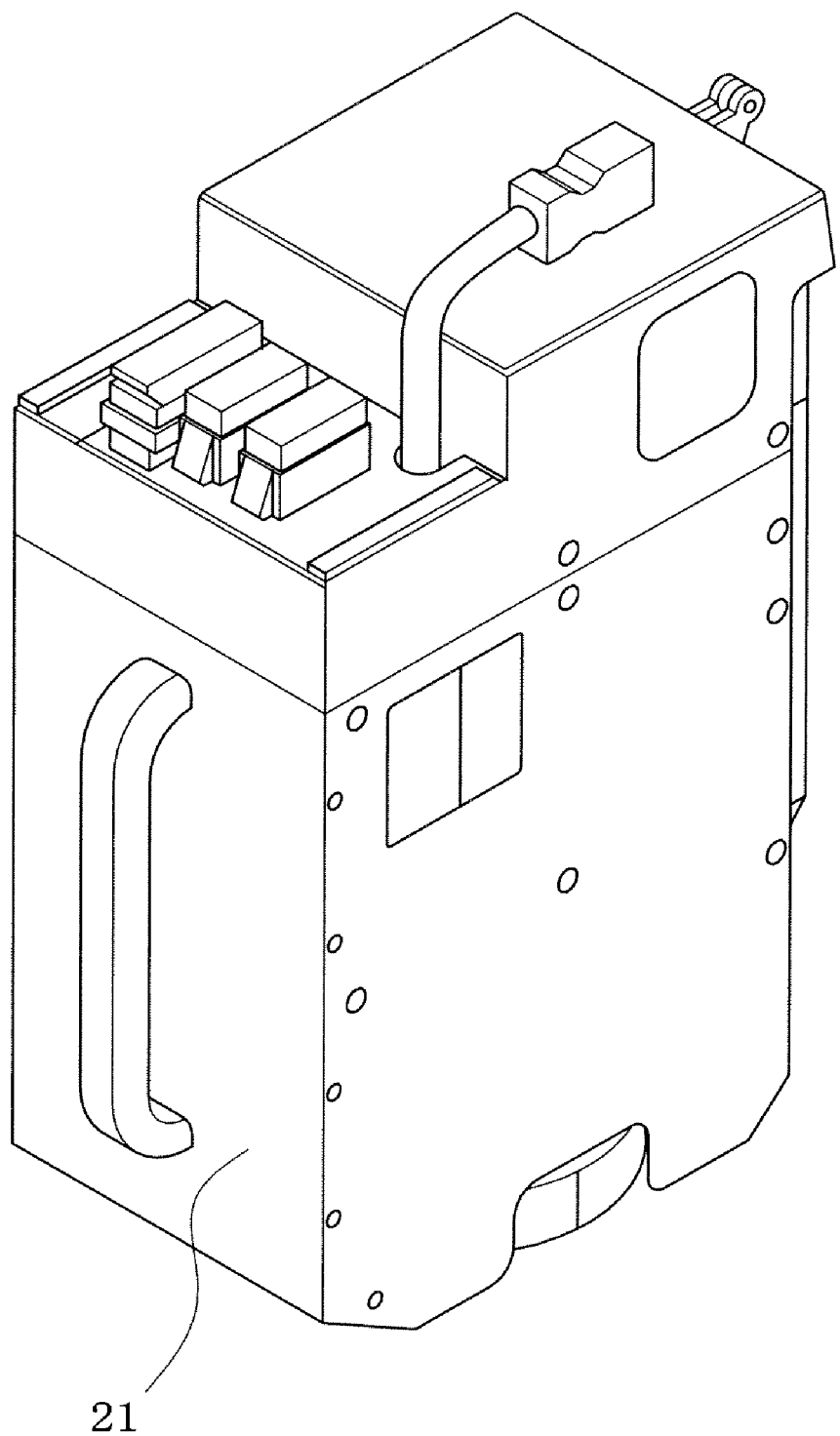
FIG. 3 is an external perspective view of an inspection camera unit.
Figure 4:
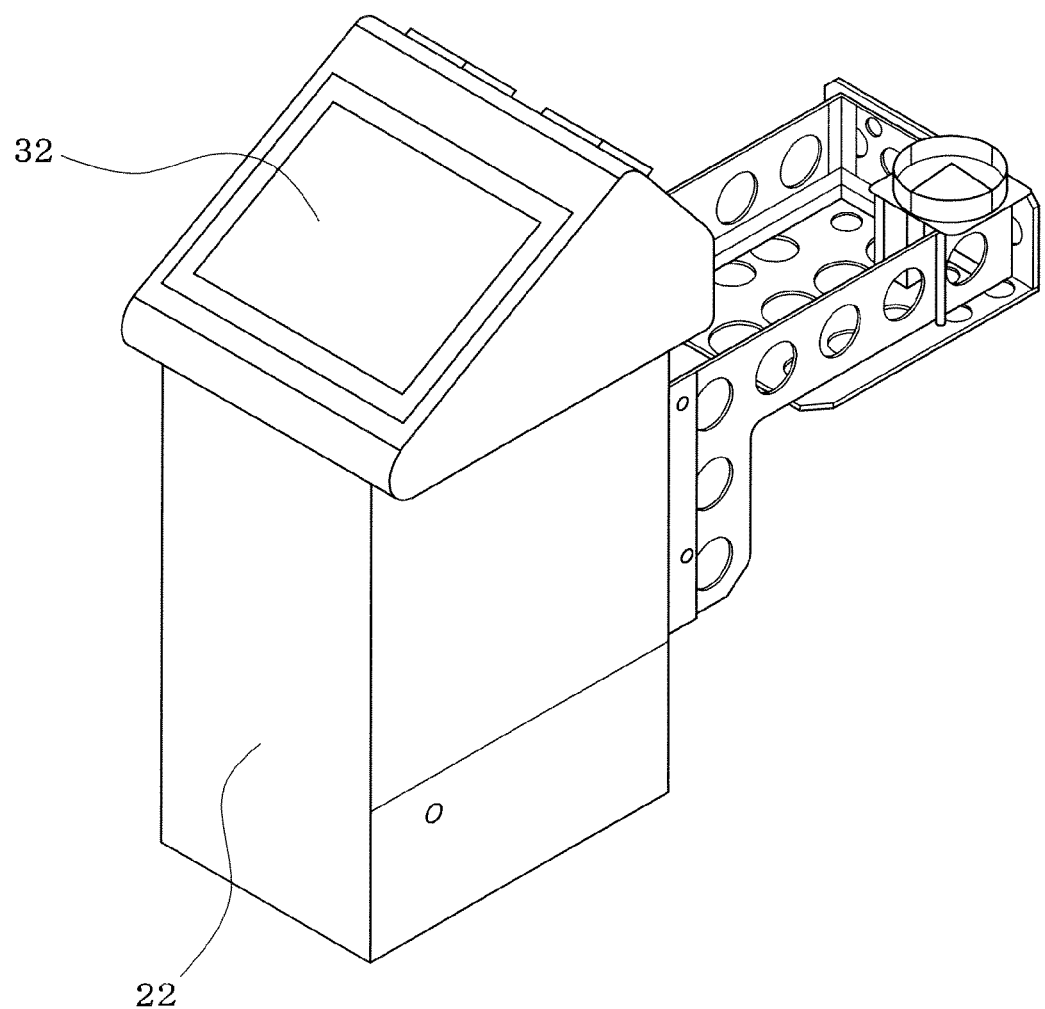
FIG. 4 is an external perspective view of an inspection image processing unit.

On the moving mechanism 20 of any of the mounting machine modules 12, an inspection camera unit 21 (refer to FIG. 3) that images an inspection target part of the circuit board can be mounted replaceably with the mounting head 17. Also on the feeder mount base of any of the mounting machine modules 12, an inspection image processing unit 22 (refer to FIG. 4) that processes an image signal output from the inspection camera unit 21 to inspect the inspection target part of the circuit board can be mounted replaceably with the feeder 14.

Figure 5:
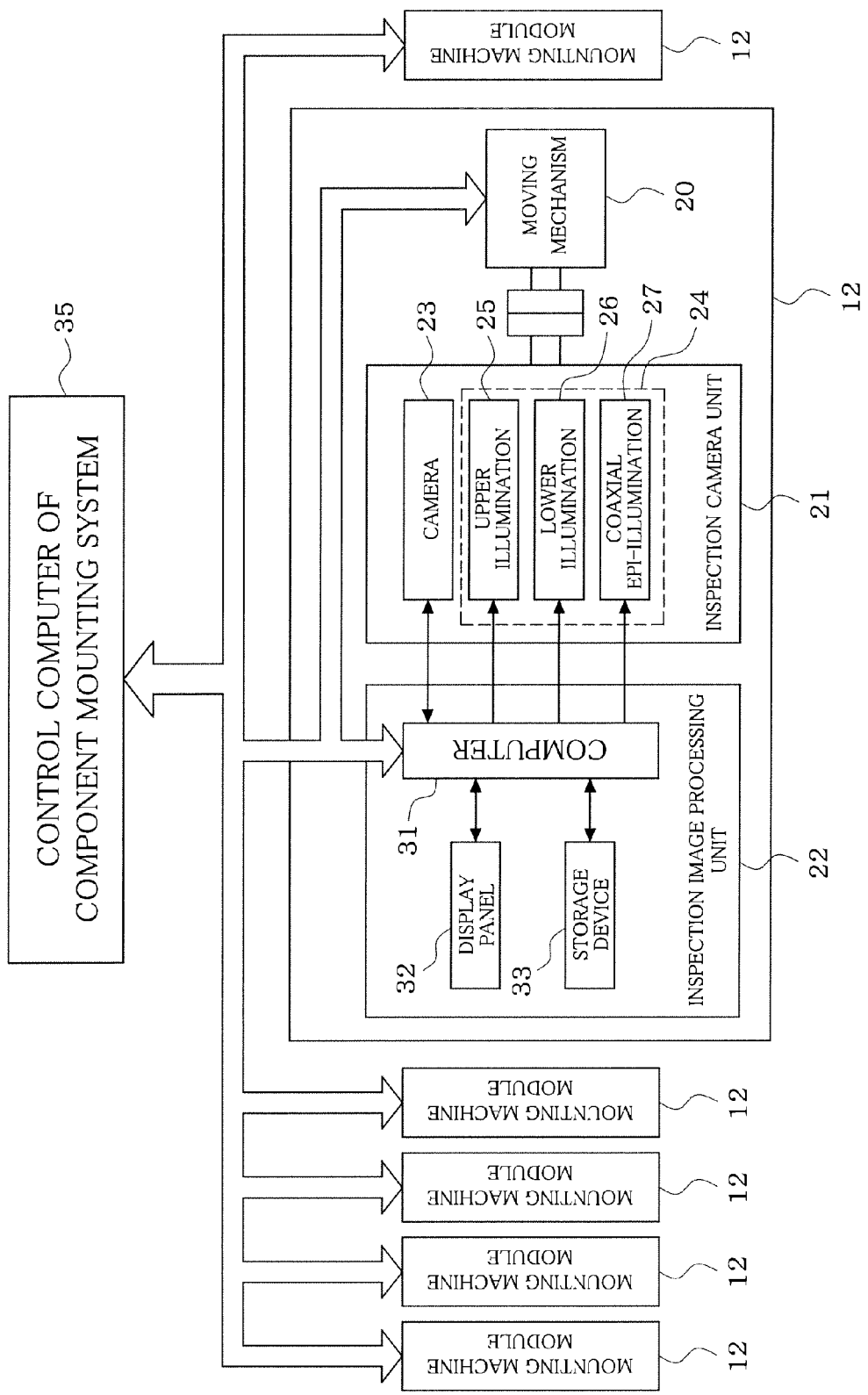
FIG. 5 is a block diagram depicting a system structure.

As depicted in FIG. 5, the inspection camera unit 21 has a camera 23 that images an inspection target part of the circuit board, an illumination device 24 that illuminates the inspection target part of the circuit board, and others incorporated therein. The illumination device 24 includes, for example, illumination light sources of three types (an upper illumination 25, a lower illumination 26, and a coaxial epi-illumination 27). By combining these illumination light sources of three types, an illumination pattern can be selected from among illumination patterns of three types.

For example, when the edge of a component mounted on a circuit board is desired to be imaged clearly, the upper illumination 25 is used for illumination. When a character, symbol, mark, or the like rendered on the surface of the circuit board is desired to be imaged clearly, the lower illumination 26 is used for illumination. When the presence or absence of a component on the circuit board is desired to be imaged clearly, the coaxial epi-illumination 27 is used for illumination. When accuracy in image recognition of the inspection target part is insufficient with the selected illumination pattern, the illumination pattern may be changed and then again the inspection target part may be subjected to image recognition for inspection.

On the other hand, the inspection image processing unit 22 is provided with a computer 31 for image processing, a display panel 32 (a display unit) that displays inspection information, a storage device 33 that stores an inspection image processing program and various data, such as a result of learning conforming-item data. The display panel 32 includes a touch panel, for example, and also functions as an inspecting-method setting panel that allows an operator to set an inspecting method. For example, an image imaged by the camera 23 is displayed on the display panel 32, and the part or component to be desired for inspection is touched by the operator in the image displayed on the display panel 32. With this, the inspection target part is inspected.

Note that, as a matter of course, a function of setting an inspecting method may be provided separately from the display panel 32. A function of displaying inspection information and a function of setting an inspecting method may be provided to a control device of the component mounting system. As a matter of course, these functions may be provided to both of the inspection image processing unit 22 and the control device of the component mounting system.

The computer 31 for image processing functions as learning means that learns conforming-item data obtained through an inspection and inspecting means that inspects the inspection target part by comparing the result of image processing of the inspection target part of the circuit board with a learning value of the conforming-item data by executing the inspection image processing program. For example, color information of the component imaged by the camera 23 may be learned and stored in the storage device 33, thereby inspecting the presence or absence of that component. Alternatively, image data of a mounting surface of a circuit board determined through an inspection as conforming may be learned, the image of the mounting surface of the circuit board to be inspected is compared with a learning value of the image data of the mounting surface of the circuit board and, from data about a difference therebetween, the presence or absence of a foreign substance attached on the mounting surface of the circuit board may be inspected. When the result of image processing of the inspection target part is different from the learning result of the conforming-item data, that means the presence of some abnormality in the inspection target part, and therefore the circuit board can be determined as defective.

The computer 31 for image processing controls an imaging operation of the camera 23 of the inspection camera unit 21 and an illumination pattern (lighting/lights-out of the upper illumination 25, the lower illumination 26, and the coaxial epi illumination 27).

A control computer 35 of the component mounting system controls a mounting operation of each of the mounting machine modules 12, and also controls an operation of the moving mechanism 20 that supports the inspection camera unit 21.

In the present embodiment, a conveyor (not shown) that discharges a circuit board determined as defective by the inspection image processing unit 22 is removably mounted on the feeder mount base of the mounting machine module 12 having the inspection camera unit 21 and the inspection image processing unit 22 mounted thereon or a mounting machine module 12 that comes immediately thereafter. With this, the circuit board determined as defective through an inspection can be discharged by the conveyer without being passed to a mounting machine module 12 on a downstream side. Therefore, when the defective part of the circuit board is repairable, the remaining components can be mounted with the defective part repaired, thereby improving yields.

When a production job is such that with the use of the above-structured component mounting system, a mounting machine module 12 on an upstream side mounts an electronic component required to be shielded on a circuit board and a mounting machine module 12 on a downstream side mounts a shielding case on the circuit board so as to cover the electronic component, the inspection camera unit 21 and the inspection image processing unit 22 can be mounted on an arbitrary one of the mounting machine modules 12 positioned between the mounting machine module 12 that mounts the electronic component required to be shielded and the mounting machine module 12 that mounts the shielding case. With this, the mounting state of the shielding target component can be inspected before the shielding case is mounted.

Also, when a production job is such that any one of the mounting machine modules 12 mounts a BGA-type component, the inspection camera unit 21 and the inspection image processing unit 22 can be mounted on an arbitrary one of the mounting machine modules 12 positioned on an upstream side from the mounting machine module 12 that mounts a BGA-type component. With this, the state of the mounting surface (such as the presence or absence of a foreign particle) of the circuit board can be inspected before a BGA-type component is mounted.

Furthermore, in the case of a production job without requiring an inspection, the inspection camera unit 21 and the inspection image processing unit 22 can be removed from the mounting machine module 12 and be placed between the mounting head 17 and the feeder 14. With this, as depicted in FIG. 2, all of the mounting machine modules 12 in the component mounting system can be used as mounting machines.

According to the embodiment described in the foregoing, the inspection camera unit 21 is removably mounted, in place of the mounting head 17, on the moving mechanism 20 of any one of the plurality of mounting machine modules 12, and the inspection image processing unit 22 is removably mounted, in place of the feeder 14, on the feeder mount base of that mounting machine 12. Therefore, a dedicated inspection machine module is not required to be newly manufactured, thereby reducing a burden of cost. Also, since all what is required is to have the inspection camera unit 21 and the inspection image processing unit 22 mounted on any of the mounting machine modules 12, an operation of changing the position of an inspection device at the time of changing a production job can be simplified, its operation time can be shortened, and the operation rate of the component mounting system can be improved. Furthermore, an image signal is processed at the inspection image processing unit 22 mounted on the feeder mount base of the mounting machine module 12 for inspecting the inspection target part of the circuit board. Therefore, the load of arithmetic operation of the control computer 35 in the component mounting system can be prevented from being increased due to image processing for inspection, and high-resolution image processing can be performed at the inspection image processing unit 22 to improve inspection accuracy.

Note that the present invention is not meant to be restricted to the embodiment described above, and can be variously modified within a range of not deviating from the gist of the present invention. For example, two or more of the mounting machine modules 12 may have the inspection camera unit 21 and the inspection image processing unit 22, and two or more of the mounting machine modules 12 in the component mounting system may be used as inspection machines.

This application claims priority from Japanese Patent Application 2010-116793, filed May 20, 2010, which is incorporated herein by reference in its entirety.

What is claimed is:

1. A component mounting system comprising:
   (a) mounting machines arranged along a direction of conveying a circuit board;
   (b) a feeder mount base in each of the mounting machines;
   (c) a feeder removably mounted on the feeder mount base of each of the mounting machines;
   (d) a mounting head in each of the mounting machines, the mounting head sucking a component supplied from the feeder for mounting on the circuit board;
   (e) a moving mechanism in each of the mounting machines, the moving mechanism configured to removably mount and move the mounting head;
   (f) an inspection camera unit mounted, replaceably with the mounting head, on the moving mechanism of any one of the mounting machines, the inspection camera unit configured to image an inspection target part of the circuit board; and
   (g) an inspection image processing unit mounted, replaceably with the feeder, on the feeder mount base where the inspection camera unit is mounted, the inspection image processing unit processing an image signal output from the inspection camera unit to inspect the inspection target part.

2. The component mounting system according to claim 1, wherein
   one of the mounting machines on an upstream side mounts on the circuit board an electronic component required to be shielded, and another one of the mounting machines on a downstream side mounts a shielding case on the circuit board so as to cover the electronic component, and
   still another one of the mounting machines having the inspection camera unit and the inspection image processing unit mounted on the still another one of the mounting machines is between the one of the mounting machines that mounts the electronic component required to be shielded and the another one of the mounting machines that mounts the shielding case.

3. The component mounting system according to claim 1, wherein
   any one of the mounting machines mounts a BGA-type component, and
   the mounting machine having the inspection camera unit and the inspection image processing unit mounted on the mounting machine is on a side upstream from the any one of the mounting machines that mounts the BGA-type component.

4. The component mounting system according to claim 1, wherein
   the inspection image processing unit includes a display unit that displays inspection information and an inspection setting function of setting an inspection method by an operator.

5. The component mounting system according to claim 1, wherein
   the inspection camera unit includes an illumination device that illuminates the inspection target part.

6. The component mounting system according to claim 5, wherein
   the illumination device includes illumination light sources of a plurality of types, and is configured to allow an illumination pattern to be selected from among a plurality of illumination patterns obtained by combining the illumination light sources.

7. The component mounting system according to claim 1, wherein
   the inspection image processing unit includes learning means that learns conforming-item data obtained through an inspection and inspecting means that inspects the inspection target part by comparing a result of image processing of the inspection target part of the with the conforming-item data learned by the learning means.

8. The component mounting system according to claim 1, wherein
   a conveyor that discharges a circuit board determined by the inspection image processing unit as defective is removably mounted on the feeder mount base of the mounting machine having the inspection camera unit and the inspection image processing unit mounted on the mounting machine or one of the mounting machines that comes immediately after the mounting machine having the inspection camera unit and the inspection image processing unit.

* * * * *